United States Patent [19]

Tanagawa

[11] Patent Number: 4,566,111
[45] Date of Patent: Jan. 21, 1986

[54] WATCHDOG TIMER

[75] Inventor: Kouji Tanagawa, Tokyo, Japan

[73] Assignee: OKI Electric Industry Co., Tokyo, Japan

[21] Appl. No.: 547,932

[22] Filed: Nov. 2, 1983

[30] Foreign Application Priority Data

Nov. 4, 1982 [JP] Japan ................................. 57-192558

[51] Int. Cl.$^4$ ............................................. H03K 21/30
[52] U.S. Cl. ....................................... 377/28; 377/39; 328/129.1
[58] Field of Search .................. 377/28, 39; 328/129.1

[56] References Cited

U.S. PATENT DOCUMENTS

| | | | |
|---|---|---|---|
| 4,079,234 | 3/1978 | Kashio | 377/39 |
| 4,161,649 | 7/1979 | Klos et al. | 377/39 |
| 4,189,635 | 2/1980 | Sheller | 377/39 |

*Primary Examiner*—John S. Heyman
*Attorney, Agent, or Firm*—Martin Novack

[57] ABSTRACT

A watchdog timer for monitoring the operation of a computer monitors if the period of a writing signal ($W_T$) generated by each execution of an instruction of a program is within the predetermined duration. The present watchdog timer comprises a register (2) for storing predetermined DATA upon receipt of the writing signal ($W_T$), a counter (4) which is incremented by a clock pulse ($\phi$), a comparator (3) for providing coincidence output signal when content of the counter reaches said predetermined DATA in the register (2), a first flip-flop ($F_1$) for storing said coincidence output signal for one period of said clock pulse ($\phi$), a second flip-flop ($F_2$) for storing said coincidence output signal upon receipt of said clock pulse ($\phi$), a third flip-flop ($F_3$) for storing output of said second flip-flop ($F_2$) upon receipt of said clock pulse ($\phi$), an AND circuit ($G_1$) for providing logical product of reverse output ($\overline{Q_1}$) of said first flip-flop ($F_1$) and said writing signal ($W_T$), and an OR circuit ($G_2$) for receiving an output of said third flip-flop ($F_3$) and an output of said AND circuit ($G_1$) and producing an alarm signal NG which indicates an error of a computer to be monitored.

4 Claims, 5 Drawing Figures

WATCHDOG TIMER

BACKGROUND OF THE INVENTION

1. Field of the Invention

The present invention relates to a watchdog timer which monitors the operation of an electronic device, in particular, relates to such a device for the use of monitoring a one-chip micro-computer, and/or a one-chip micro-processor.

2. Background of the Invention

A watchdog timer is a sort of program timer which provides an alarm signal indicating a system error when a micro-computer program overruns.

The watchdog timer also has a counter which is reset every predetermined period while a computer-program operates correctly, and which overflows to output an alarm signal when is not reset after a predetermined period.

Said alarm signal is used for the initial reset of a hardware of a computer system, a trigger signal of an alarm buzzer, or an interruption signal for recovering from a software upset.

FIG.1A shows a block diagram of a prior-art watchdog timer acting as a program timer of which the initial preset value can be determined by a program.

The watchdog timer 1 has the register 2 for receiving preset data which determines a monitoring period the present data being preset by a writing signal $W_T$ in response to a preset instruction in a program, the counter 4 for counting the number of pulse $\phi$ which is provided every execution of an instruction of a computer, the comparator 3 for providing the coincidence output signal M when the content of the register 2 coincides with the content of the counter 4, and the start-stop control circuit 4' for controling the transmission of the clock pulse $\phi$ according to a start instruction and a stop instruction in a program.

The operation is described in accordance with FIG.1B.

When the writing signal $W_T$ (5") is applied to the watchdog timer 1, the initial data (DATA) is set in the register 2, while the counter 4 is reset to zero.

Then, when the start signal (START) is applied to the circuit 4' by the start instruction of a program, the counter 4 begins to be incremented by a clock pulse $\phi$.

When the next writing signal $W_T(5')$ is applied to the timer before the overflow of the counter 4, the next data is restored in the register 2 to restart the counting operation by the counter 4, without generating the coincidence signal M of a high level from the comparator 4.

The preset value of the register 2 can be readily changed by the data (DATA) to change a period of time of the writing signal $W_T$.

On the other hand, when there is something wrong with the operation of the program, the writing signal $W_T(6)$ is not normally provided, but the writing signal (8) is applied at a delayed timing, therefore the counter 4 overflows. In this case, the comparator 3 provides the coincidence signal M of a "high" level which indicates computer upset.

However, the watchdog timer of FIG. 1A has the disadvantage that it cannot detect such a program error as a writing signal appears early to a normal pulse to be generated at a predetermined preset time, although it can detect such a program error as writing signal appears lately to a normal pulse to be generated at a predetermined preset time.

Accordingly, a prior art watchdog timer is not enough for detecting all possible errors of a program, therefore a more reliable watchdog timer has been desired.

SUMMARY OF THE INVENTION

It is an object, therefore, of the present invention to overcome the disadvantages and limitations of a prior watchdog timer by providing a new and improved watchdog timer.

It is also an object of the present invention to provide a watchdog timer which can detect not only the late appearance of a writing signal, but also an early appearance of a writing signal.

The above and other objects are attained by a watchdog timer having a register (2) for preseting predetermined DATA upon receipt of writing signal ($W_T$), a counter (4) which is incremented by a clock pulse ($\phi$), a comparator (3) which compares content of said register (2) with contents of said counter (4) and providing coincidence output signal when those two contents coincide with each other, a first flip-flop ($F_1$) for storing said coincidence output signal for one period of said clock pulse ($\phi$), a second flip-flop ($F_2$) for storing said coincidence output signal upon receipt of said clock pulse ($\phi$), a third flip-flop ($F_3$) for storing output of said second flip-flop ($F_2$) upon receipt of said clock pulse ($\phi$), an AND circuit ($G_1$) for providing logical product of reverse output $\overline{Q}_1$ of said first flip-flop ($F_1$) and said writing signal ($W_T$), an OR circuit ($G_2$) for receiving an output of said third flip-flop $F_3$ and an output of said AND circuit ($G_1$) and producing an alarm signal NG which indicates an error of a computer to be monitored.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Figure 1A:
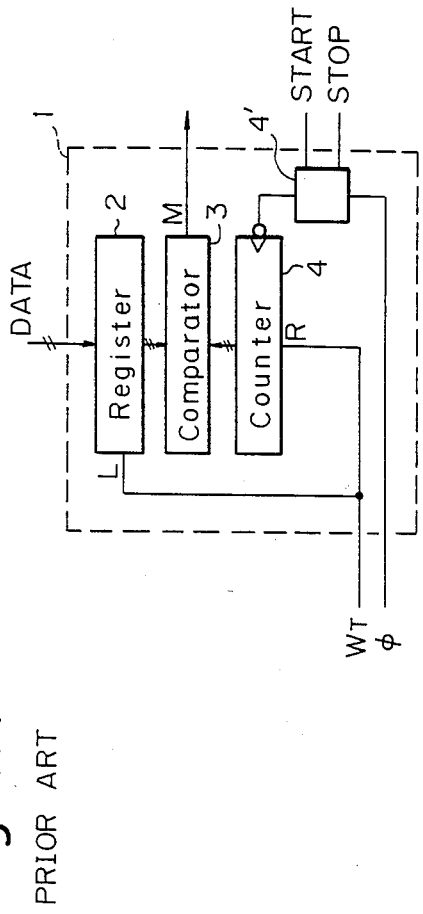
FIG. 1A is a block diagram of a prior watchdog timer.
Figure 1B:
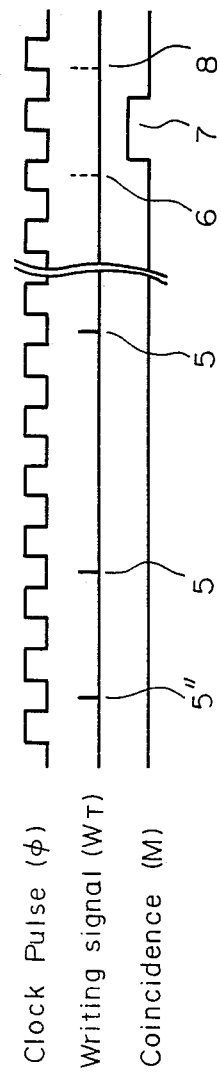
FIG. 1B is an operational time sequence of the watchdog timer of FIG. 1A.

FIG. 2 shows the block diagram of the watchdog timer according to the present invention. In the figure, the reference numeral 1 is a program timer which has the same function as that of the watchdog timer 1 of FIG. 1A, the symbol $F_1$ is a first flip-flop which holds the coincidence signal M of the comparator in response to the input pulse $\phi$ and is set by the initial reset signal RES. The symbol $F_2$ is a second flip-flop which holds the coincidence signal M by the input clock pulse $\phi$, and is reset by the writing signal $W_T$, the symbol $F_3$ is a third flip-flop which shifts the output signal $Q_2$ of the flip-flop $F_2$ by one period of the clock pulse $\phi$ in response to the clock pulse $\phi$, and is reset by the initial reset signal RES. The symbol $G_1$ is an AND circuit for providing the logical product of the inverse output $\overline{Q}_1$ of the flip-flop $F_1$ and the writing signal $W_T$, the symbol $G_2$ is an OR circuit to provide an alarm signal NG in response to the logical sum of the output $Q_2$ of the flip-flop $F_3$ and the output of the AND circuit $G_1$, and the symbol $G_3$ is an OR circuit for providing the logical sum of the writing signal $W_T$ and the output $Q_2$ of the flip-flop $F_2$ to reset the counter 4.

Figure 2A:
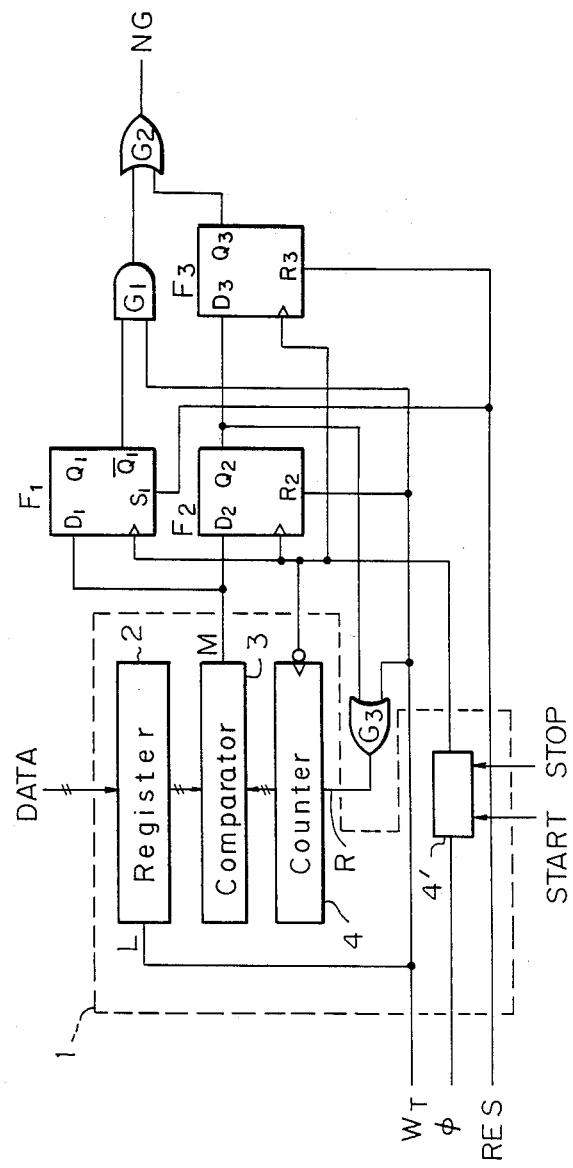
FIG. 2A is a block diagram of a watchdog timer according to the present invention.
Figure 2B:
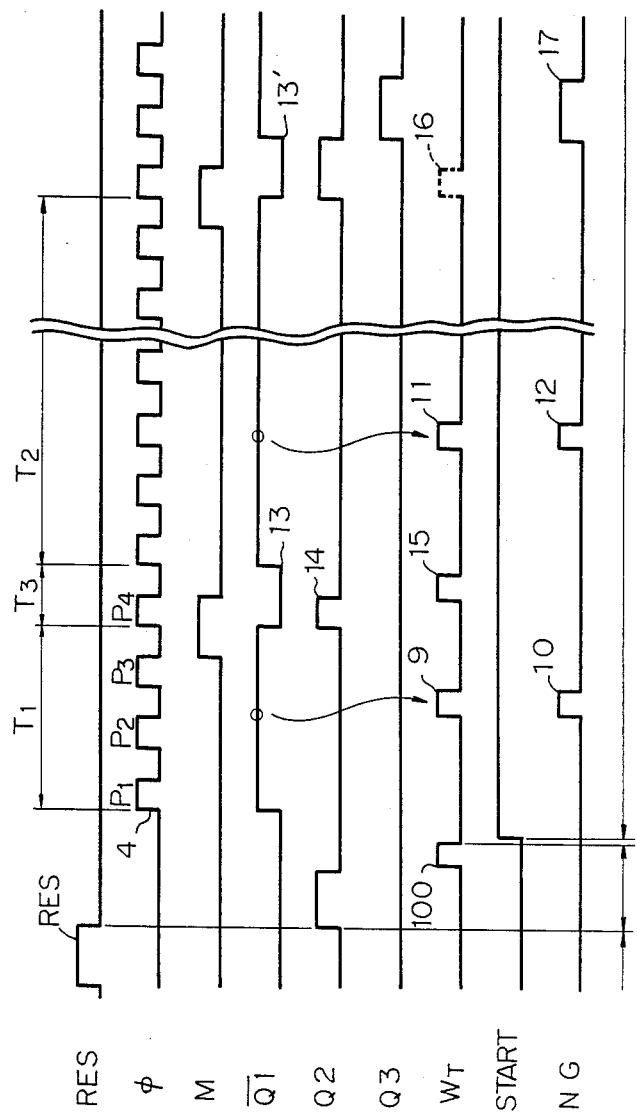
FIG. 2B is an operational time sequence of the watchdog timer of FIG. 2A.

The operation of the apparatus of FIG. 2A is described in accordance with the timing sequence of FIG. 2B.

When the initial reset signal RES is applied to the present watchdog timer, the flip-flops $F_1$ and $F_3$ are set and reset, respectively, then, the reverse output $\overline{Q}_1$ of the flip-flop $F_1$ and the output $Q_3$ of the flip-flop $F_3$ become low level (L). Since no writing signal $W_T$ exists at that moment, the output $Q_2$ of the flip-flop $Q_2$ is undecided.

Next, when the writing signal $W_T$ (100) is applied to the present watchdog timer, the register 2 stores the preset data (DATA) corresponding to a preset time which is determined by a preset instruction, and at the same time, the flip-flop $F_2$ is reset to provide low lever (L) at the output $Q_2$, and the counter 4 is reset.

Next, when the start instruction is executed, the start signal (START) is applied to the start-stop control circuit 4', and the input clock pulses ($P_1$, $P_2$, $P_3$, $P_4$) are applied to the counter 4 and the flip-flops $F_1$ and $F_2$. The duration $T_1$ which includes the input clock pulses $P_1$, $P_2$ and $P_3$ corresponds to the preset time for the monitoring the operation of the program. Then, the counter 4 begins to be incremented from an initial value, and the reverse output $\overline{Q}_1$ of the flip-flop $F_1$ becomes high level (H).

Next, when the preset time $T_1$ elapsed, the coincidence signal M becomes a "high" level, and when the next input pulse $P_4$ is provided, the reverse output $\overline{Q}_1$ becomes "low" level during the period $T_3$ (see 13 in FIG. 2B), and the output $Q_2$ of the flip-flop $F_2$ becomes a "high" level. In a normal operation, the next preset instruction is executed during the coincidence signal output duration $T_3$. Then, when the writing signal $W_T$ (15) is inputted, the register 2 presets DATA corresponding to the next preset time ($T_2$), while the counter 4 and the flip-flop $F_2$ are reset.

Since the reverse output $\overline{Q}_1$ of the flip-flop $F_1$ is in "low" level, the output of the AND circuit $G_1$ is "low" level. Since the output $Q_2$ of the flip-flop $F_2$ is also "low" level, both the outputs of the flip-flop $F_3$ and the OR circuit $G_2$ is "low" level. Therefore, no NG signal (alarm signal) appears at the output of the OR circuit $G_2$.

Assuming that the writing signal $W_T$ (9) is provided during the preset duration $T_1$ because of the upset of a computer, the AND circuit $G_1$ outputs the "high" level signal since the output $\overline{Q}_1$ of the flip-flop $F_1$ is in the "high" level. Therefore, the OR circuit $G_2$ provides the NG signal 10 of a "high" level (see FIG. 2B) irrespective of the condition of the output $Q_3$ of the flip-flop $F_3$.

On the other hand, assuming that the writing signal $W_T$ (11) is provided after the preset duration $T_1$ due to the upset of a computer, the AND circuit $G_1$ provides the "high" level output as the output $\overline{Q}_1$ of the flip-flop $F_1$ is "high" level. Therefore, the OR circuit $G_2$ provides the "high" level NG signal (12).

Further, assuming that during the presence of the coincidence signal corresponding to a preset time, the next preset instruction is not executed due to the upset of a computer, and then a writing signal $W_T$ 16 is not inputted, the output $Q_3$ of the flip-flop $F_3$ becomes "high" level. Therefore, the OR circuit $G_2$ provides the NG signal (17).

Figure 3:
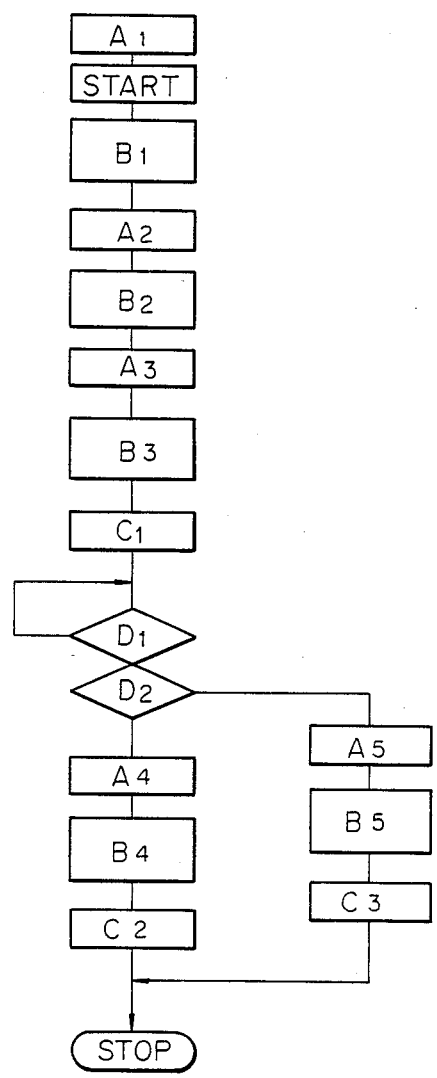
FIG. 3 is a flow chart of a computer program which is monitored by the present watchdog timer.

FIG. 3 shows a flow diagram of the micro-computer which includes the present watchdog timer. In the figure, the blocks $B_1$ through $B_5$ show the operation of a program to be monitored, and the preset durations $A_1$ through $A_4$ for monitoring said program execution durations $B_1$ through $B_4$, respectively, are preset in the watchdog timer.

The present watchdog timer is triggered at first by the start instruction (START). The box $A_1$ includes the preset operation for monitoring the program $B_1$, the box $A_2$ includes the preset operation for monitoring the program $B_2$, and the box $A_3$ includes the preset operation for monitoring the program $B_3$. The symbols $C_1$, $C_2$ and $C_3$ show the instruction for stopping the operation of the watchdog timer, and those stop instructions stop the monitoring operation when the preset duration cannot be predicted because of the presence of the waiting instruction ($D_1$) and the branch instruction ($D_2$) in a processing program. After the waiting operation, or the branch opration, the monitoring operation can be restarted by the preset instruction $A_4$ or $A_5$. The stop instructions $C_2$ and $C_3$ stop the monitoring operation because of the end of the program operation.

As described above, according to the present invention, a preset time is stored in a watchdog timer, and when said preset time elapsed, the next preset time is stored, and all the possible errors of a computer including both the status that operation time is too early, and operation time is too slow can be detected. Therefore, the present watchdog timer can detect an error of a computer with very high accuracy.

Some modifications are possible to those skilled in the art. For instance, clock pulse $\phi$ may be divided to $\frac{1}{2}$ or $\frac{1}{3}$ so that the counter is incremented for every two or three clock pulses.

From the foregoing it will now be apparent that a new and improved watchdog timer has been found. It should be understood of course that the embodiment disclosed is merely illustrative and is not intended to limit the scope of the invention. Reference should be made to the appended claims, therefore, rather than the specification as indicating the scope of the invention.

What is claimed is:

1. A watchdog timer comprising;
   a register (2) for presetting predetermined DATA upon receipt of a writing signal ($W_T$),
   a counter (4) which is incremented by a clock pulse ($\phi$),
   a comparator (3) which compares contents of said register (2) with contents of said counter and providing a coincidence output signal when two contents coincide with each other,
   a first flip-flop ($F_1$) for storing said coincidence output signal for one period of said clock pulse $\phi$,
   a second flip-flop ($F_2$) for storing said coincidence output signal upon receipt of said clock pulse $\phi$,
   a third flip-flop ($F_3$) for storing output of said second flip-flop $F_2$ upon receipt of said clock pulse $\phi$,
   an AND circuit ($G_1$) for providing logical product of a reverse output $\overline{Q}_1$ of said first flip-flop $F_1$ and said writing signal ($W_T$) , and
   an OR circuit ($G_2$) for receiving an output of said third flip-flop $F_3$ and an output of said AND circuit ($G_1$) and producing an alarm signal NG which indicates an error of a computer to be monitored.

2. A watchdog timer according to claim 1 further comprising a start-stop circuit (4') which selectively transmits said clock pulse $\phi$ in responce to an instruction.

3. A watchdog timer according to claim 1 further comprising an OR circuit ($G_3$) which receives said writing signal $W_T$ and an output of said second flip-flop $F_2$ to reset said counter(4).

4. A watchdog timer according to claim 1, wherein said flip-flops $F_1$ and $F_3$ are set and reset, respectively, by an initial reset signal RES.

* * * * *